United States Patent
Miyoshi

(10) Patent No.: US 6,518,728 B2
(45) Date of Patent: Feb. 11, 2003

(54) SECONDARY BATTERY DEVICE AND METHOD OF PROTECTING AN OVERDISCHARGE OF THE SAME

(75) Inventor: Motohiro Miyoshi, Kyoto (JP)

(73) Assignee: GS-Melcotec Co., Ltd., Kyoto (JP)

( * ) Notice: Subject to any disclaimer, the term of this patent is extended or adjusted under 35 U.S.C. 154(b) by 0 days.

(21) Appl. No.: 10/052,596

(22) Filed: Jan. 23, 2002

(65) Prior Publication Data

US 2002/0158608 A1 Oct. 31, 2002

(30) Foreign Application Priority Data

Jan. 24, 2001 (JP) ........................................ 2001-015233
Dec. 12, 2001 (JP) ........................................ 2001-378936

(51) Int. Cl.[7] .................................................. H02J 7/14
(52) U.S. Cl. ................. 320/134; 320/DIG. 13
(58) Field of Search ................. 320/134, 136, 320/132, 162, DIG. 13

(56) References Cited

U.S. PATENT DOCUMENTS 5,896,025 A * 4/1999 Yamaguchi et al. ........ 320/132
6,340,880 B1 * 1/2002 Higashijima et al. ....... 320/166

* cited by examiner

Primary Examiner—Gregory J Toatley, Jr.
(74) Attorney, Agent, or Firm—Sughrue Mion, PLLC

(57) ABSTRACT

When the main body of personal computer for example stays in the active state, the signal from the signal terminal 8 is always on a low level. The discharge to the main body of personal computer continues and hence the power supply is prevented from being forced to be turned off so far as the total terminal voltage of all the unit batteries 2 does not fall below 11.2 V even if some of the unit batteries 2 show a terminal voltage of less than 2.5 V, thereby keeping the switching element 4 on. Accordingly, the occurrence of defectives on hard disk or the like due to forced disconnection of power supply can be prevented as much as possible.

8 Claims, 3 Drawing Sheets

FIG. 2

| | TERMINAL VOLTAGE OF UNIT BATTERY | OUTPUT OF OR GATE 11 | TOTAL TERMINAL VOLTAGE | OPERATION STATE (SIGNAL TERMINAL) OF MAIN BODY OF PERSONAL COMPUTER | OUTPUT OF TOTAL VOLTAGE DETECTING PORTION 10 | OPERATION STATE OF SWITCHING ELEMENT 4 |
|---|---|---|---|---|---|---|
| PATTERN 1 | NORMAL | L | NORMAL | OPERATION STATE (H) OTHER THAN STATES (i) AND (ii) | L | ON (DISCHARGED) |
| PATTERN 2 | ANY ONE FALLS BELOW 2.5V | H | NORMAL | | L | OFF (DISCONNECTED) |
| PATTERN 3 | NORMAL | L | FALLS BELOW 13.2V | | H | OFF (DISCONNECTED) |
| PATTERN 4 | ANY ONE FALLS BELOW 2.5V | H | FALLS BELOW 13.2V | | H | OFF (DISCONNECTED) |
| PATTERN 5 | NORMAL | L | NORMAL | OPERATION STATE (L) OF STATES (i) OR (ii) | L | ON (DISCHARGED) |
| PATTERN 6 | ANY ONE FALLS BELOW 2.5V | H | NORMAL | | L | ON (DISCHARGED) |
| PATTERN 7 | NORMAL | L | FALLS BELOW 11.2V | | H | OFF (DISCONNECTED) |
| PATTERN 8 | ANY ONE FALLS BELOW 2.5V | H | FALLS BELOW 11.2V | | H | OFF (DISCONNECTED) |

SECONDARY BATTERY DEVICE AND METHOD OF PROTECTING AN OVERDISCHARGE OF THE SAME

BACKGROUND OF THE INVENTION

1. Field of the Invention

The present invention relates to a secondary battery device comprising an overdischarge protective unit and a method of protecting an overdischarge of the secondary battery.

2. Description of the Related Art

A secondary battery device comprises, e.g., a plurality of unit batteries connected in series. In such a secondary battery device, some of the unit batteries can be overcharged or overdischarged due to variation of the capacity or internal impedance of the unit batteries. For example, when a lithium ion battery as a unit battery is overcharged beyond a tolerance voltage, the decomposition reaction of an organic electrolyte proceeds. On the contrary, when the lithium ion battery is overdischarged, it shows an increase of internal resistance or the like, causing the deterioration of performance or safety thereof.

Thus, a battery device normally comprises a protective circuit incorporated therein. The group of unit batteries is electrically connected to an external circuit, such as load and charger, through the protective circuit. The protective circuit individually detects the terminal voltage of each of the unit batteries. When one of the unit batteries shows a terminal voltage of higher than a predetermined reference voltage, the protective circuit causes an FET element or the like to disconnect the battery device from the external circuit so that charge or discharge is forced to suspend. Therefore, the overcharge and overdischarge can be prevented, thereby protecting the unit batteries.

A potable personal computer or the like is subject to defectives, such as troubles in hard disk, when the power supply is forced to be turned off while CPU is in a predetermined operation state, such as reading of data. Such a forced suspension of discharge should be avoided as much as possible. It is inconvenient also for cellular phone that the power supply is forced to be turned off during communication.

In the conventional secondary battery device, when the terminal voltages of the unit batteries show a great variation, the protective circuit causes the suspension of discharge to an apparatus such as main body of personal computer to prevent one of the unit batteries from being overdischarged, even if the total battery voltage of the secondary battery device falls within a normal range which allows the supply of electric power high enough to operate the apparatus. As a result, it is much likely that the power supply can be forced to be turned off even when CPU of personal computer is in a predetermined operation state or cellular phone is communicating. Of course, it is necessary that the unit batteries be protected against overdischarge or the like. However, there are many cases where the continuation of predetermined operation state of load should be given priority.

SUMMARY OF THE INVENTION

An object of the invention is to provide a secondary battery device and a method of protecting an overdischarge of the secondary battery, which is subject as little as possible to defectives, such as disconnection of power supply in a predetermined operation state of load.

In order to accomplish the object above, the following means are adopted. The secondary battery device according to a first aspect of the invention comprises a secondary battery, a load state judging unit, and an overdischarge protective unit connected to the secondary battery. The secondary battery supplies electric power into a load circuit. The load state judging unit judges the operation state of the load circuit. The overdischarge protective unit detects the discharged state of the secondary battery, and breaks the discharge from the secondary battery when the secondary battery reaches a predetermined discharged state. When the load state judging unit judges the load circuit stays in a predetermined operation state requiring the protection of power supply, the supply of electric power into the load circuit is allowed to continue without breaking the discharge from the secondary battery.

The "a predetermined operation state of the load circuit requiring the protection of power supply" as used herein may be set to stay in any of the following states (1), (2). The predetermined operation state of the load circuit may be arbitrarily set by the user or may be previously fixed to the definite conditions by the manufacturer.

(1) State where the load circuit or various instruments connected thereto can be subject to defectives when the power supply is forced to be disconnected In some detail, when the secondary battery device according to the invention is applied, e.g., to a portable personal computer or the like, the load circuit may be set to stay in any of the following states (i) to (iv):

(i) State where a hard disk is driven;

(ii) So-called active state where CPU performs an application program on the basis of an input signal inputted by key operation while the application program is being started;

(iii) Processing awaiting state where a successive input signal is awaited after the termination of the foregoing active state while the application program is being started; and (iv) Processing awaiting state with low power consumption, i.e., so-called sleep state which suppresses the power consumption when the processing awaiting state continues for a predetermined period of time.

(2) State where the load circuit or various instruments connected thereto cannot be used, even though not going so far as defective in the state (1), when the power supply is forced to be disconnected.

Specific examples of this state include:

(i) Calling state where a calling operation is effected upon the reception of communication signal, and communicating state between off hook and on hook when the secondary battery device according to the invention is applied to cellular phone; and (ii) State where communication with the base station is conducted when the secondary battery device according to the invention is applied to data communication terminals.

In accordance with the present invention, the overdischarge protective unit allows the supply of electric power into the load circuit to continue without breaking the discharge from the secondary battery when the load state judging unit judges that the load circuit stays in the predetermined operation state requiring the protection of power supply. Accordingly, the occurrence of defectives such as sudden disconnection of power supply can be prevented as much as possible when the load circuit stays in the predetermined operation state requiring the protection of power supply, such as state where the hard disk of personal computer is driven or communicating state of cellular phone.

The risk of overdischarging to an extent such that the terminal voltage of the secondary battery falls below a predetermined reference voltage can be eliminated by providing the secondary battery device with an overdischarge preventive function on the load circuit side thereof. The secondary battery device may be overdischarged when the load circuit stays in a predetermined operation state. However, it is thought that the load circuit stays in a predetermined operation state requiring the protection of power supply for a short period of time. Accordingly, the operation of the load circuit is normally terminated as early as possible by the use of a mechanism which informs the exterior of the fact that the secondary battery is overdischarged. For example, the mechanism informs to the exterior by means of displaying on the display of the personal computer or sounding an alarm. By doing so, the secondary battery device cannot reach an abnormal state developed by the continuation of overdischarge and thus can be recovered to its normal terminal voltage after being charged.

The secondary battery may be a plurality of unit batteries connected in series. The unit battery includes not only a single battery cell but also a plurality of battery cells connected in parallel.

A secondary battery device according to a second aspect of the invention comprises a secondary battery, a load state judging unit, a total voltage detecting unit, and an overdischarge protective unit. The secondary battery comprises a series combination of a plurality of unit batteries. The load state judging unit judges the operation state of the load circuit. The total voltage detecting unit detects the total terminal voltage of the plurality of unit batteries. The overdischarge protective unit is connected to the plurality of unit batteries. The overdischarge protective unit detects the discharged state of each of the unit batteries based on their terminal voltage, and breaks the discharge from said secondary battery when any of the unit batteries reaches a predetermined overdischarge state. When the load state judging unit judges that the load circuit stays in a predetermined operation state requiring the protection of power supply, the supply of electric power into the load circuit is allowed to continue without breaking the discharge from the secondary battery when the total terminal voltage is not lower than a predetermined total reference voltage even if any of the plurality of unit batteries shows a terminal voltage failing below a predetermined unit reference voltage.

In this arrangement, when the load state judging unit judges that the load circuit stays in a predetermined operation state requiring the protection of power supply, the supply of electric power into the load circuit is allowed to continue when the total terminal voltage is not lower than a predetermined total reference voltage even if any of the plurality of unit batteries shows a terminal voltage falling below a predetermined unit reference voltage. Accordingly, even when the secondary battery device is not provided with an overdischarge preventive function on the load circuit side thereof, the risk of overdischarging to an extent such that the total terminal voltage of the secondary battery falls below a predetermined total reference voltage can be eliminated by the secondary battery device alone.

In the above-mentioned secondary battery, it is preferable that the load state judging unit judges the operation state of the load circuit on the basis of a load current value supplied into the load circuit.

In this arrangement, the operation state of the main body of personal computer can be judged by the secondary battery device alone without using any arrangement such as reception of a signal indicating the operation state from the main body of personal computer.

BRIEF DESCRIPTION OF THE DRAWINGS

FIG. 2 is a table illustrating the operation state of the secondary battery device of FIG. 1.

DETAILED DESCRIPTION OF THE INVENTION

First Embodiment

Figure 1:
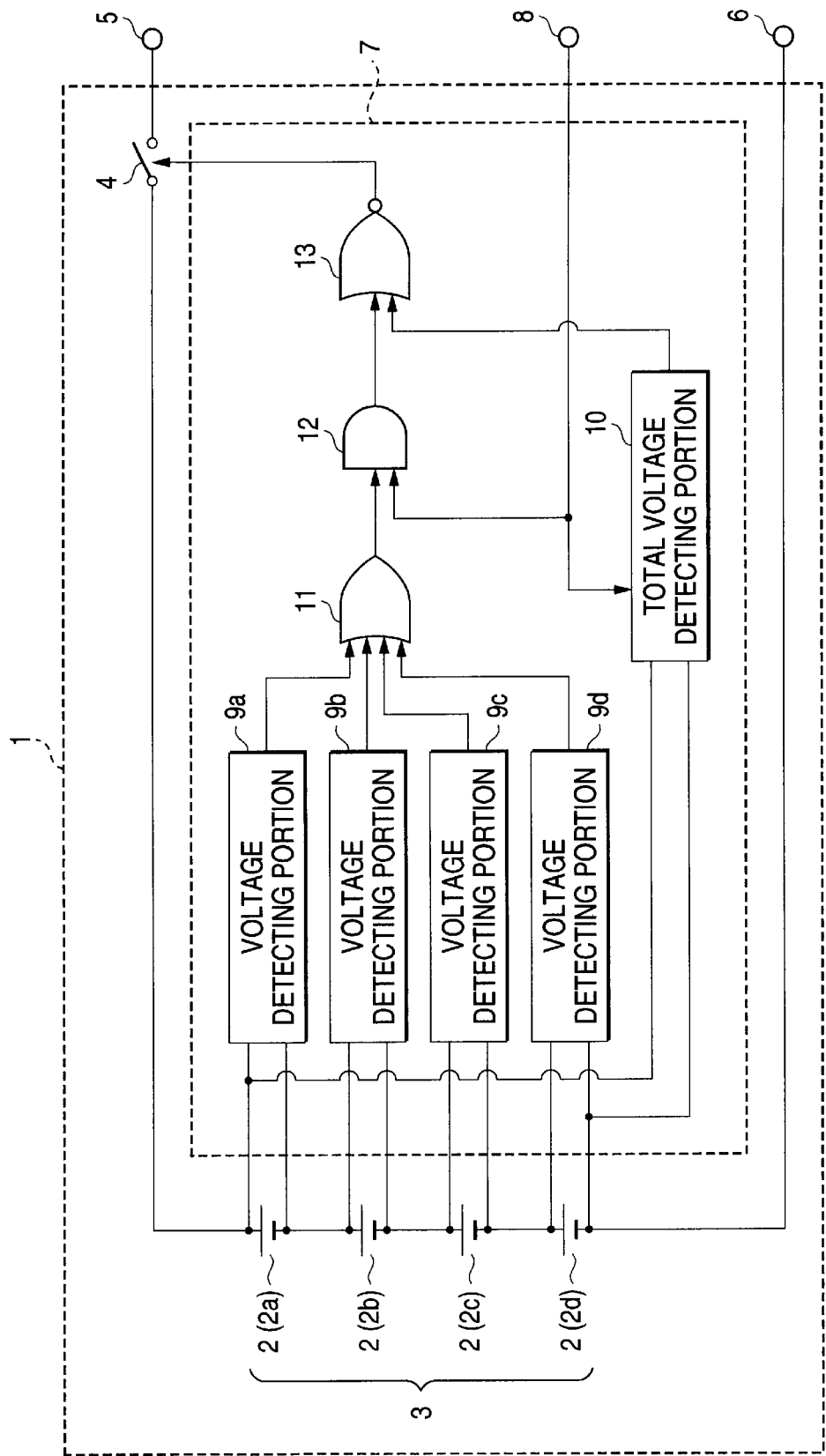
FIG. 1 is a block diagram illustrating the electrical configuration of a secondary battery device according to a first embodiment of implication of the invention.

The first embodiment of implication of the invention will be further described in connection with FIGS. 1 and 2.

A secondary battery device 1 according to the present embodiment is used, e.g., as a power supply for portable personal computer. FIG. 1 shows the electrical configuration of the secondary battery device 1. A battery cell 2 (2*a* to 2*d*) corresponds to "unit battery" of the present invention (hereinafter the battery cell 2 is referred as unit battery 2). A secondary battery 3 (nominal voltage: 14.8 V (=3.7×4)) comprises four unit batteries 2 (2*a* to 2*d*) in series. The secondary battery 3 is connected to a power supply terminal 5 on the positive side thereof through a switch element 4 such as an FET. Further, the secondary battery 3 is connected to a grounding terminal 6 on the negative side thereof. By turning the switching element 4 on, electric power is supplied into the main body of a personal computer (not shown) connected to the power supply terminal 5 and the grounding terminal 6. On the contrary, by turning the switching element 4 off, the discharge to the main body of personal computer breaks to suspend the supply of electric power into the main body of personal computer. A controller 7 performs on-off control of the switching element 4 on the basis of the terminal voltage of the unit battery 2 as described later. The controller 7 and the switching element 4 corresponds to the "overdischarge protective unit" of the present invention.

A signal terminal 8 corresponds to the "load state judging unit" of the present invention. The signal terminal 8 receives a low level signal from a detection circuit (not shown) provided in the main body of personal computer when the main body of personal computer stays in any of the following states (i) and (ii). When the main body of personal computer stays in neither of the following states (i) and (ii), the signal terminal 8 receives a high level signal from the detection circuit. These signals are given to a total voltage detecting portion 10 and an AND gate 12 described later.

(i) State where a hard disk is driven; and (ii) So-called active state where CPU performs an application program on the basis of an input signal inputted by key operation while the application program is being started.

The above states (i) and (ii) correspond to the "operation state requiring the protection of power supply" of the present invention.

The internal configuration of the controller 7 will be described hereinafter. The interior of the controller 7 comprised four voltage detecting portions 9a to 9d, a total voltage detecting portion 10, an OR gate 11, an AND gate 12, and an NOR gate 13. The voltage detection portions 9a to 9d detect the terminal voltage of the respective unit batteries 2. The total voltage detecting portion 10 detects the total terminal voltage of the unit batteries 2. The voltage detecting portions 9a to 9d are provided for the respective unit batteries 2 to detect individually the terminal voltage thereof. When the detected terminal voltage falls below a unit reference voltage (e.g., 2.5 V), a high level signal is then given to the AND gate 12. The total voltage detecting portion 10 is connected to the positive electrode or negative electrode of the both end unit batteries 2a and 2d of the unit batteries to detect the total terminal voltage of the unit batteries 2 and compare it with a total reference voltage. When the detected voltage is not lower than the total reference voltage, a low level signal is outputted to the NOR gate 13. On the contrary, when the detected voltage falls below the total reference voltage, a high level signal is outputted to the NOR gate 13.

Two such total reference voltages are selectively provided. When a low level signal is received from the signal terminal 8 (when the main body of personal computer stays in the foregoing state (i) or (ii)), a first total reference voltage (e.g., 11.2 V) is set as the total reference voltage of the total voltage detecting portion 10. On the contrary, when a high level signal is received from the terminal signal 8 (when the main body of personal computer stays in a state other than the foregoing states (i) and (ii), e.g., sleep state described later), a second total reference voltage (e.g., 13.2 V) is set as the total reference voltage of the total voltage detecting portion 10.

The first and second reference voltages may be the same or different. However, the discharge current is smaller in the state other than the states (i) and (ii) than in the state (i) or (ii). Therefore, when the main body of computer stays in the state other than the states (i) and (ii), the resulting voltage drop is small, causing the suspension of discharge at the detected voltage close to the open circuit voltage. On the contrary, when the main body of computer stays in the state (i) or (ii), the resulting voltage drop is great, causing the suspension of discharge at a voltage considerably lower than the open circuit voltage. Accordingly, when the first and second total reference voltages are predetermined to the same value, overdischarge occurs more deeply in the operation state other than the states (i) and (ii) than in the states (i) or (ii). In order to avoid this trouble, it is preferred in the present embodiment that the first total reference voltage (e.g., 11.2 V) in the operation state (i) or (ii) be predetermined to be lower than the second total reference voltage (e.g., 13.2 V) in the operation state other than the states (i) and (ii). By doing so, when the main body of personal computer stays in the operation state other than the states (i) and (ii), the overdischarge protective unit can be actuated earlier.

To the input terminal of the OR gate 11 are connected the output of the voltage detecting portions 9a to 9d. When any of the terminal voltage of the unit batteries 2 detected by the voltage detecting portions 9a to 9d falls below 2.5 V (unit reference voltage), a high level signal is then given to the input of the AND gate 12. When both the output of the OR gate 11 and the output of the signal terminal 8 are on a high level, the AND gate 12 outputs a high level signal. In other cases, the AND gate 12 outputs a low level signal. The NOR gate 13 outputs a signal (low level signal) which indicates the disconnection of the main body of personal computer from the unit batteries 2, to the switching element 4 when the output of the AND gate 12 is on a high level or a high level signal which indicates that the detected voltage of the total voltage detecting portion 10 falls below 11.3 V (the first total reference voltage) or 13.2 V (the second total reference voltage) is inputted to the NOR gate 13 from the total voltage detecting portion 10.

The operation of the present embodiment having the foregoing constitution will be described hereinafter by referring to the operation state table shown in FIG. 2.

A personal computer stays in the foregoing state of hard disk driving or active state as well as in various operation states such as state awaiting input signal during the starting of application program. These states require different electric current values to be supplied.

For example, when the processing awaiting state continues for a predetermined period of time with the application program being started, displaying on the display is extinguished and the operating speed of CPU is lowered to proceed to a processing awaiting state with low power consumption of personal computer, i.e., so-called sleep state. Even in such a sleep state, electric current of several milliamperes always flows from the secondary battery 3 to the main body of personal computer. Thus, the secondary battery 3 is gradually discharged. Therefore, some of the unit batteries 2 show a terminal voltage of lower than 2.5 V due to the variation of the capacity of the unit batteries 2 of the secondary battery 3, etc.

In FIG. 2, patterns 1 to 4 shows the operation state of switching element when the main body of computer stays in the state other than the states (i) and (ii), patterns 5 to 8 shows the operation state of switching element when the main body of computer stays in the state (i) or (ii).

As shown in FIG. 2, in patterns 1 to 4, since the output of the signal terminal 8 is always on a high level, when the terminal voltage of some of the unit batteries 2 falls below 2.5 V and the OR gate 11 outputs a high level signal, the output of the AND gate 12 is on a high level. Hence, the NOR gate 13 outputs the low level signal, causing the switching element 4 to be turned off (patterns 2, 4). In other words, regardless of the total terminal voltage of all the unit batteries 2, the unit batteries 2 are disconnected from the main body of personal computer so that the power supply is forced to be turned off. Thus, the unit batteries 2 are preferentially prevented from being overdischarged, making it possible to prevent the deterioration of performance or life of the secondary battery 3.

When the power supply is forced to be turned off in the sleep state, data which has not been saved so far can be lost. However, the sleep state exists when the user does not use the personal computer over a predetermined period of time or longer and thus is often allowed to stand over an extended period of time. For such an operation state which can be allowed to stand over an extended period of time, it is similarly preferred that overdischarge be preferentially prevented. Accordingly, the present embodiment is arranged such that when any of the unit batteries 2 shows a terminal voltage of less than 2.5 V, the power supply is forced to be turned off.

When all the unit batteries show a terminal voltage of not lower than 2.5 V and the output of the AND gate is on a low level, if the total terminal voltage falls below 13.2 V, the NOR gate 13 outputs a low level signal which then turns the switching element 4 off (pattern 3). Accordingly, the unit batteries are disconnected from the main body of personal computer, making it possible to prevent the decomposition of the electrolyte due to overdischarge while it is stood over an extended period of time. Hence the desired safety and performance of the battery can be maintained.

On the other hand, when the main body of personal computer reaches the foregoing active state upon the reception of input signal inputted by key operation before reaching the foregoing sleep state, a large load current flows from the secondary battery 3 to the main body of personal computer. Then, some of the unit batteries 2 may show a terminal voltage of less than 2.5 V even for a short period of time due to the variation of capacity of the unit batteries of the secondary battery 3.

Therefore, as shown in FIG. 2, in patterns 5 to 8, since the signal from the signal terminal 8 is always on a low level, even when some of the unit batteries 2 show a terminal voltage of less than 2.5 V and the OR gate 11 outputs a high level signal, the output of AND gate 12 is on a low level. Accordingly, the NOR gate 13 outputs a high level signal which then keeps the switching element 4 on to cause the supply of electric power to continue so far as the total terminal voltage of all the unit batteries 2 does not falls below 11.2 V (pattern 6). Although, some of the unit batteries 2 which show the terminal voltage of less than 2.5 V are kept to be discharged during this period, this active state is normally terminated in a short period of time and then the processing awaiting state is again reached. Thereafter, as in the foregoing sleep state, some of the unit batteries 2 show a terminal voltage of less than 2.5 V, forcing the power supply to be turned off. Thus, by preventing as much as possible the power supply from being forced to be turned off in the active state, the occurrence of defectives of the hard disk can be prevented.

The active state sometimes continues for a extended period of time when a large amount of data is stored. In this case, an arrangement can be made such that the fact that some of the unit batteries 2 are overdischarged is made known to the exterior by displaying on the display of the personal computer or sounding an alarm. With such arrangement, the active state is broken and the system takes processing awaiting state from active state. Hence, it possible to prevent as much as possible the power supply from being forced to be turned off in the active state. It is thought that when the battery is charged thereafter, the terminal voltage of some of the unit batteries 2 is restored, eliminating troubles. When the battery is discharged as abnormally as the total terminal voltage falls below 11.2 V, the NOR gate 13 outputs a low level signal regardless of the output of the AND gate 12 to cause the switching element 4 to be turned off (patterns 7, 8), eliminating the risk of electrolyte leakage.

Thus, while the hard disk is being driven, or while CPU of the main body of personal computer stays in the active state, even if some of the unit batteries 2 show a terminal voltage of less than 2.5 V, discharge to the main body of personal computer is continued to prevent the power supply from being forced to be turned off so far as the total terminal voltage of the secondary battery 3 does not falls below 11.2 V. Accordingly, the occurrence of defectives on hard disk or the like due to forced disconnection of power supply can be prevented as much as possible.

Second Embodiment

Figure 3:
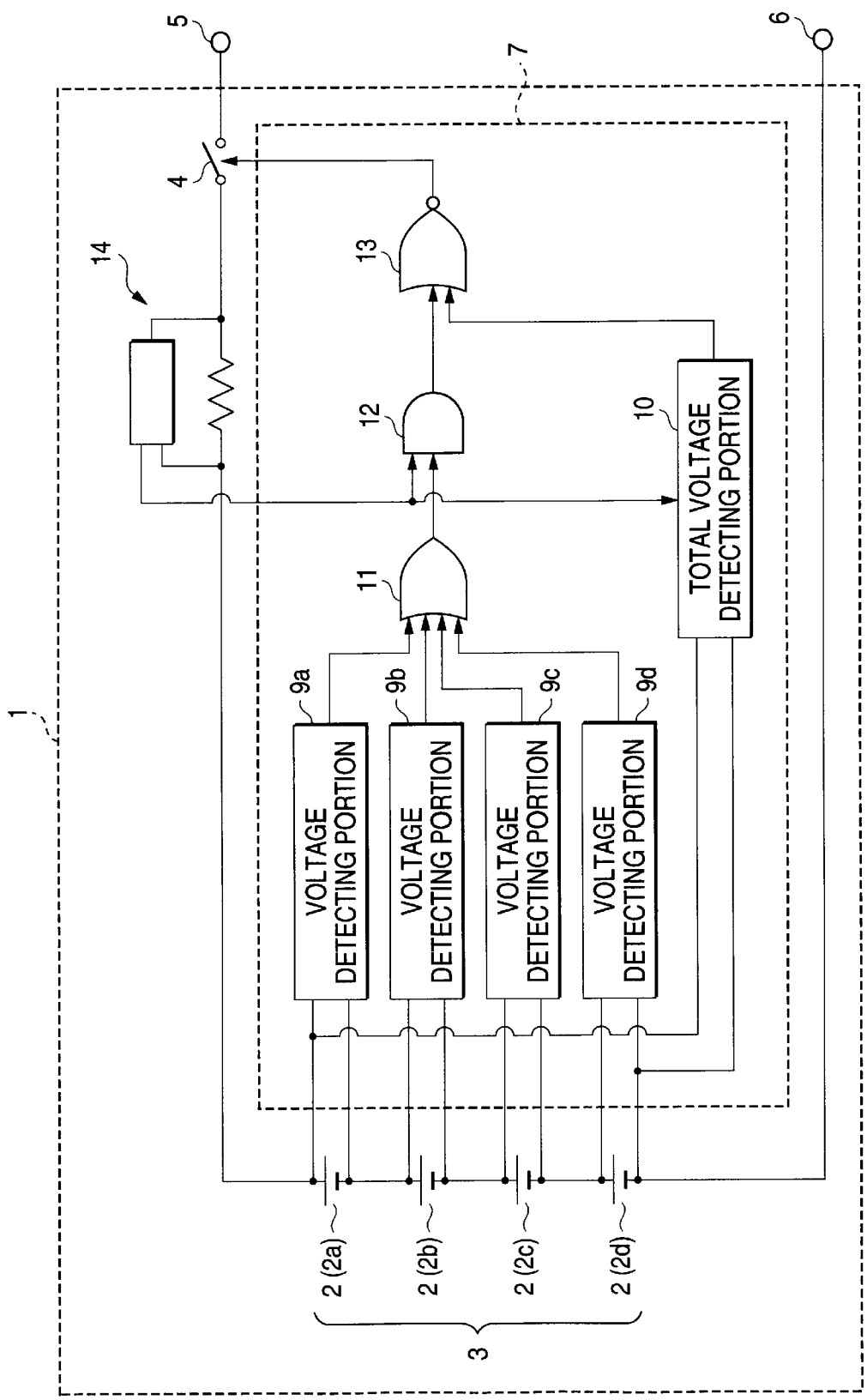
FIG. 3 is a block diagram illustrating the electrical configuration of a secondary battery according to a second embodiment of implication of the invention.

FIG. 3 illustrates a second embodiment of implication of the invention. The second embodiment is the same as the first embodiment except the structure of the load state judging unit. Accordingly, like numerals are used for like components in the first and second embodiments. The description of like components is omitted. The components different from those of the first embodiment will be described hereinafter.

The value of load current supplied from the secondary battery device 1 into the main body of personal computer varies with the operation state of the main body of personal computer. In some detail, when the power supply is turned off, the load current is not greater than several milliamperes (about 3 mA). When the main body of personal computer stays in the idle state, the load current is scores of milliamperes (about 75 mA). While only OS is being started, the load current is about 1 A on the average. While an application program is being started, the load current is about 1.5 A at maximum. In the present embodiment, a current detecting circuit 14 is provided between the positive electrode of the unit batteries 2 and the power supply terminal 5 instead of the signal terminal 8. The current detecting circuit 14 detects the load current flowing through the power supply line during discharge to the main body of personal computer. When the load current thus detected exceeds a predetermined reference value (e.g., 70 mA), a low level signal is given to the total voltage detecting portion 10 and the AND gate 12. On the contrary, when the load current thus detected falls below the predetermined reference value, a high level signal is given to the total voltage detecting portion 10 and the AND gate 12. The operation of the controller 7 on the basis of the change of signal level is the same as the operation based on the change of signal level of the signal terminal 8 in the first embodiment.

In this arrangement, the operation state of the main body of personal computer can be judged by the secondary battery device alone without using any arrangement such as reception of a signal indicating the operation state from the main body of personal computer.

Other Embodiments

The invention is not limited to the foregoing embodiments. The following embodiments are included in the technical scope of the invention. Other various changes and modifications can be made therein without departing from the spirit and scope thereof.

(1) In the foregoing embodiments, the secondary battery device 1 comprises a secondary battery 3 including four unit batteries 2 (2a to 2d) by way of example. The invention is not limited thereto. The secondary battery device 1 may comprise a secondary battery including a single unit battery or five or more unit batteries.

(2) In the foregoing embodiments, the secondary battery device is applied to a portable personal computer. The invention is not limited thereto. The effect of the invention can be exerted for various apparatus energized by a secondary battery device (e.g., cellular phone).

(3) The "predetermined operation state of the load circuit requiring the protection of power supply" is defined to state of hard disk driving and active state in the first embodiment. The invention is not limited thereto. Any one of these states may be defined. Alternatively, these states may be defined including processing awaiting state (excluding sleep state). The predetermined state of operation of the load circuit may be previously fixed to the definite conditions by the manufacturer. Alternatively, a level changing unit for changing the level of signal inputted to the signal terminal 8 from the main body of personal computer may be provided so that the predetermined operation state of the load circuit may be arbitrarily determined by user.

(4) The "predetermined operation state of the load circuit requiring the protection of power supply" is defined to state where the load current is, e.g., not lower than 70 mA, i.e., idle state, state where OS alone is started or state where an application program is started. The invention is not limited thereto. By changing the predetermined reference value of the current detecting circuit 14, the load circuit can be predetermined to stay in various states.

What is claimed is:

1. A secondary battery device comprising:
   a secondary battery for supplying electric power into a load circuit;
   a load state judging unit for judging an operation state of said load circuit; and
   an overdischarge protective unit connected to said secondary battery for detecting a discharged state of said secondary battery and breaking the discharge from said secondary battery when said secondary battery reaches a predetermined overdischarged state, said over discharge protective unit allows the supply of electric power into said load circuit to continue without breaking the discharge from said secondary battery when said load state judging unit judges that said load circuit stays in a predetermined operation state requiring a protection of power supply.

2. A secondary battery device comprising:
   a secondary battery comprising a series combination of a plurality of unit batteries for supplying electric power into a load circuit;
   a load state judging unit for judging an operation state of said load circuit;
   a total voltage detecting unit for detecting a total terminal voltage of said plurality of unit batteries; and
   an overdischarge protective unit connected to said plurality of unit batteries for detecting a discharged state of each of said unit batteries and breaking the discharge from said secondary battery when any of said unit batteries reaches a predetermined overdischarge state, said overdischarge protective unit allowing the supply of electric power into said load circuit to continue without breaking the discharge from said secondary battery if the total terminal voltage is not lower than a predetermined total reference voltage, when said load state judging unit judges that said load circuit stays in a predetermined operation state requiring a protection of power supply.

3. The secondary battery device according to claim 1, wherein said load state judging unit judges the operation state of said load circuit on the basis of a load current value supplied into said load circuit.

4. The secondary battery device according to claim 2, wherein said load state judging unit judges the operation state of said load circuit on the basis of a load current value supplied into said load circuit.

5. A method of protecting an overdischarge of a secondary battery, said method comprising:
   supplying electric power into a load circuit;
   judging an operation state of said load circuit; and
   detecting a discharged state of said secondary battery and breaking the discharge from said secondary battery when said secondary battery reaches a predetermined overdischarged state,
   wherein the supply of electric power into said load circuit continues without breaking the discharge from said secondary battery when said load circuit is judged that it stays in a predetermined operation state requiring a protection of power supply.

6. The method of protecting an overdischarge of a secondary battery device according to claim 5, further comprising:
   detecting a total terminal voltage of a plurality of unit batteries of a secondary battery; and
   detecting a discharged state of each of said unit batteries and breaking the discharge from said secondary battery when any of said unit batteries reaches a predetermined overdischarge state,
   wherein the supply of electric power into said load circuit continues without breaking the discharge from said secondary battery if the total terminal voltage is not lower than a predetermined total reference voltage, when said load circuit is judged that it stays in the predetermined operation state requiring the protection of power supply.

7. The method of protecting an overdischarge of a secondary battery device according to claim 5, wherein the operation state of said load circuit is judged on the basis of a load current value supplied into said load circuit.

8. The method of protecting an overdischarge of a secondary battery device according to claim 6, wherein the operation state of said load circuit is judged on the basis of a load current value supplied into said load circuit.

* * * * *